(12) United States Patent
Chen et al.

(10) Patent No.: US 11,612,273 B2
(45) Date of Patent: Mar. 28, 2023

(54) MONITORING APPARATUS AND A FOOD PROCESSING DEVICE USING THE SAME

(71) Applicant: KONINKLIJKE PHILIPS N.V., Eindhoven (NL)

(72) Inventors: Yun Chen, Shanghai (CN); Ming Sun, Shanghai (CN); Wen Sun, Shanghai (CN); Guangming Su, Shanghai (CN); Weihua Lu, Shanghai (CN)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 472 days.

(21) Appl. No.: 16/467,545

(22) PCT Filed: Dec. 6, 2017

(86) PCT No.: PCT/EP2017/081600
§ 371 (c)(1),
(2) Date: Jun. 7, 2019

(87) PCT Pub. No.: WO2018/108642
PCT Pub. Date: Jun. 21, 2018

(65) Prior Publication Data
US 2019/0320850 A1     Oct. 24, 2019

(30) Foreign Application Priority Data

Dec. 15, 2016  (WO) ................ PCT/CN2016/000686
Mar. 21, 2017  (EP) ..................................... 17161964

(51) Int. Cl.
*G05B 15/02*     (2006.01)
*A47J 43/07*     (2006.01)
(Continued)

(52) U.S. Cl.
CPC ........... *A47J 43/0716* (2013.01); *A47J 43/06* (2013.01); *G01N 15/1475* (2013.01);
(Continued)

(58) Field of Classification Search
CPC ...... A47J 43/0716; A47J 43/06; A47J 43/046; G05B 19/042; G05B 15/02; G05B 11/36;
(Continued)

(56) References Cited

U.S. PATENT DOCUMENTS 4,541,573 A * 9/1985 Fujiwara ............... A47J 43/085
241/101.2
6,387,424 B2    5/2002 Funk
(Continued)

FOREIGN PATENT DOCUMENTS

AU   2011227140    9/2011
CN   1784149 A    6/2006
(Continued)

OTHER PUBLICATIONS

International Search Report and Written Opinion dated Apr. 18, 2018 for International Application No. PCT/EP2017/081600 filed Dec. 6, 2017.
(Continued)

*Primary Examiner* — Michael W Choi
(74) *Attorney, Agent, or Firm* — Schott, P.C.

(57) ABSTRACT

The invention relates to a monitoring apparatus configured to monitor a processing status of a food item under processing in a food processor, the monitoring apparatus comprising a sensor operable to determine characteristic information related to the food item in the food processor, a controller configured to provide a control signal to the food processor to control an operation of the food processor when the determined characteristic 5 information or a rate of change of the determined characteristic information meets a predetermined criteria.

14 Claims, 9 Drawing Sheets

(51) Int. Cl.
    *G05B 19/042* (2006.01)
    *A47J 43/06* (2006.01)
    *G05B 11/36* (2006.01)
    *G01N 15/14* (2006.01)
    *G01R 27/14* (2006.01)
    *G01N 21/85* (2006.01)

(52) U.S. Cl.
    CPC ............ *G01N 21/85* (2013.01); *G01R 27/14* (2013.01); *G05B 11/36* (2013.01); *G05B 15/02* (2013.01); *G05B 19/042* (2013.01); *G05B 19/0428* (2013.01)

(58) Field of Classification Search
    CPC .... G05B 19/0428; G01R 27/14; G01N 21/85; G01N 15/1475
    See application file for complete search history.

(56) References Cited

U.S. PATENT DOCUMENTS

| | | | | |
|---|---|---|---|---|
| 6,587,575 | B1* | 7/2003 | Windham | G01N 33/12 |
| | | | | 382/110 |
| 7,036,687 | B1* | 5/2006 | Lowe | A47J 31/401 |
| | | | | 222/129.1 |
| 7,952,697 | B2 | 5/2011 | Fedele | |
| 2005/0069175 | A1 | 3/2005 | Parente | |
| 2006/0086843 | A1 | 4/2006 | Lin | |
| 2010/0040728 | A1* | 2/2010 | Henderson | C12Y 204/01099 |
| | | | | 426/10 |
| 2011/0005402 | A1 | 1/2011 | Huang | |
| 2013/0098249 | A1 | 4/2013 | Fidler | |
| 2014/0263780 | A1 | 9/2014 | Day | |
| 2017/0049701 | A1* | 2/2017 | Kushner | A61K 9/127 |
| 2021/0204757 | A1* | 7/2021 | Palmer | A47J 43/0727 |

FOREIGN PATENT DOCUMENTS

| | | | |
|---|---|---|---|
| CN | 102331277 A | 1/2012 | |
| CN | 202457893 U | 10/2012 | |
| CN | 104941716 A | 9/2015 | |
| CN | 105378457 A | 3/2016 | |
| CN | 105451566 A | 3/2016 | |
| CN | 105708306 A | 6/2016 | |
| CN | 106102480 A | 11/2016 | |
| EP | 2654523 | 12/2015 | |
| EP | 3042591 | 7/2016 | |
| JP | 2013248166 | 12/2013 | |
| KR | 1586175 | 1/2016 | |
| WO | 2013072798 | 5/2013 | |
| WO | WO-2014191873 A1 * | 12/2014 | ........... A23N 12/125 |

OTHER PUBLICATIONS

Hongbo, S., et al., "Physical Properties of Food", pp. 83-92, Aug. 31, 2016.

* cited by examiner

MONITORING APPARATUS AND A FOOD PROCESSING DEVICE USING THE SAME

CROSS REFERENCE TO RELATED APPLICATIONS

This application is the U.S. National Phase application under 35 U.S.C. § 371 of International Application No. PCT/EP2017/081600 filed Dec. 6, 2017, published as WO 2018/108642 on Jun. 21, 2018, which claims the benefit of European Patent Application Number 17161964.6 filed Mar. 21, 2017 and Patent Application Number PCT/CN2016/000686 filed Dec. 15, 2016. These applications are hereby incorporated by reference herein.

FIELD OF THE INVENTION

The present invention generally relates to a monitoring apparatus for monitoring a processing status of the food under processing in a food processor, and a food processor utilising such a monitoring apparatus.

BACKGROUND OF THE INVENTION

EP3042591A1 discloses that to improve the particle size regulation produced by a coffee grinder associated with an espresso coffee dispensing machine, a method is described comprising the steps of acquiring, via a sensor, a data or an electrical signal indicative of the shape of the thread of liquid coffee while it percolates from the outlet of the machine, driving an operator of the grinder to regulate the particle size thereof as a function of the detected signal or data.

US2006086843A1 discloses that a blender includes a container mounted removably on a housing for containing food items and provided with a cutting blade unit that is to be driven rotatably by a motor unit when the container is mounted on the housing. A control unit is operable in accordance with an initial control signal from a switch unit so as to activate the motor unit to operate in a judgment mode. The control unit determines food processing conditions in accordance with a motor rotation signal generated by a sensor unit for indicating a rotary speed of the motor unit when the motor unit is operated in the judgment mode. The control unit switches operation of the motor unit from the judgment mode to a food processing mode upon determining the food processing conditions so as to drive rotation of the cutting blade unit to blend the food items contained in the container.

US2011005402A1 discloses that a heating control structure of a food processor includes a cup body, a cutter disposed in the cup body, a heating disk, a heating tube, a temperature sensor, a temperature switch and a fixing seat. The temperature sensor and the temperature switch are attached to an upper surface of the fixing seat. A lower surface of the fixing seat is connected with power connecting feet and temperature transmitting feet. Upper ends of the power connecting feet are connected to the temperature switch. Upper ends of the temperature transmitting feet are connected to the temperature sensor. The temperature sensor, the temperature switch, the power connecting feet and the temperature transmitting feet are fixed to the fixing seat. To assemble the present invention, they are first mounted on the fixing seat and their connecting wires are also connected with each other. After that, the fixing seat is mounted in the cup body, so that a modular assembly is completed. This is beneficial to simplify production, enhance efficiency and lower fraction defective.

In recent years there has been greater awareness of healthy eating and consumers are generally more cautious of their eating habit as well as nutrients intake. One way of increasing nutrients intake and their bioavailability/bio-accessibility is by blending food, such as fruits and vegetables, to reduce its particle size before consuming. It is noted that reducing food to smaller particle size not only maximises the nutrients intake but also provides some digestive health benefits. The inventors have established that plant tissue particle size is associated with micronutrients release and its bio-accessibility. In addition, the intrinsic characteristics of the blended food (such as juices) including dry matter, total soluble solids content, pH, electrical conductivity, turbidity, and particle size can affect the consumer's sensory perception, such as taste and mouthfeel of the blended food. The relationship between these parameters are summarised in FIG. 1.

Food processors, or sometimes referred to as food blenders, are used to chop or slice solid food such as fruits, vegetables, and meats in a container with a rotating blade to pulverise the food into finely divided particles. Blended food often gives an unsmooth mouthfeel due to the presence of dietary fibres that are mainly made of cell-wall compositions, such as pectin, cellulose, semi-cellulose and so on. Insufficient blending would fail to disrupt cell walls of fruits and vegetables into desired fine and homogenous level, which would not meet the consumer's expectation in taste or texture as well as nutrients intake. However, over-blending could also reduce micronutrients in the food, due to heat generated by the rotating blade of the food processor.

SUMMARY OF THE INVENTION

In view of the foregoing, there is a need in the art for a solution capable of monitoring a processing status of the food under processing in a food processor in order to achieve an optimum level of blending so that the food is blended into a desired fine and homogenous level, meanwhile, keep more nutrients retained in the foods.

In one aspect of the invention there is provided a monitoring apparatus configured to monitor a processing status of a food item under processing in a food processor, the monitoring apparatus comprising:

a sensor operable to determine characteristic information related to the food item in the food processor, the characteristic information being associated with a nutrient trend of the food item;

a controller configured to provide a control signal to the food processor to control an operation of the food processor when the determined characteristic information or a rate of change of characteristic information meets a predetermined criteria.

This invention provides a monitoring apparatus that can be used to control the operation of a food processor such that a desired level of nutrient value of the food under processing can be obtained and the expectation of the consumer in terms of taste and nutrients intake is satisfied.

Preferably, the controller is further configured to provide the control signal to terminate the operation of the food processor when the predetermined criteria is met. This effectively switches off the food processor once the desired level of nutrient value is obtained. Therefore, this allows the food to be blended sufficiently to meet the consumer's expectation in taste, and keep more nutrients retained in the food.

The controller may be configured to determine a nutrient value based on the determined characteristic information.

The predetermined criteria may include the determined nutrient value being equal to or above a predetermined nutrient value.

The nutrient value may be determined by comparing the determined characteristic information with a predetermined set of nutrient values.

The characteristic information may include, but not limited to, one or more of the following: a particle size value, an electrical conductivity value, a pH value, a dry matter value, and a soluble solids content value.

In one embodiment, the sensor may include a particle image analysis system configured to detect an image of the food item under processing in the food processor and to generate a corresponding image data. The particle image analysis system is further configured to process the image data to determine a particle size value of the food item.

The particle image analysis system may comprise an image detection unit.

The image detection unit may include a charge coupled device (CCD) image sensor or a complementary metal-oxide-semiconductor image sensor. However, the skilled person in the art will appreciate that any suitable image detection unit for capturing an image of the food item in the food processor and generating a corresponding image data may be employed. For example, the image detection unit may comprise an optical microscope that operates in cooperation with the CCD image sensor to allow microscopic images to be captured. The optical microscope and the CCD image sensor may be arranged as an integrated unit (i.e. a microscopic CCD image sensor) or provided as separate units having connections with each other.

The particle image analysis system may further comprise an image processing unit operable to process the image data to determine a particle size value of the food item. The image processing unit is further operable to output the determined particle size value as the characteristic information related to the food item under processing in the food processor.

The particle image analysis system may be integrated within a food processor, or can be provided as a separate unit connectable with the food processor. In use, the image detecting unit of the particle image analysis system may be arranged in or in the vicinity of a receptacle for receiving a food item of the food processor such that an image of the food item in the receptacle can be detected when the food processor is in used.

The image detection unit may be configured to detect an image of the food item at a periodic time interval and to generate a corresponding image data at the periodic time interval. Effectively, this allows the particle size value of the food item to be determined periodically. The skilled person in the art will appreciate that the accuracy of the monitoring apparatus improves with the reduction of the time interval between detections of the image of the food item. Accordingly, the image processing unit may be configured to detect an image of the food item continuously in real time during operation of the food processor.

In another embodiment, the sensor comprises a conductance sensor when in use is in contact with the food item under processing in the food processor, and the conductor sensor is operable to determine an electrical conductivity (EC) value of the food item.

The conductance sensor may comprise two or more electrodes when in use is in contact with the food item in the food processor. Preferably, the conductance sensor comprises a pair of electrodes. In one configuration, the conductance sensor may comprise a pair of electrodes when in use is arranged in a receptacle for receiving a food item of the food processor such that the pair of electrodes are in contact with the food item under processing in order to determine the EC value of the food item.

The conductance sensor may further comprise an output port from which the determined EC value of the food item can be output to a further device.

The further device may be a controller unit. Accordingly, the sensor may further comprise a controller unit configured to determine a change in an EC value of the food item based on the EC value determined over a period of time.

The change in an EC value of the food item may be determined by determining the difference between a determined EC value at a start of an operation of the food processor and a time period after the start of the operation. The time period may be a predetermined time period.

The controller unit may be further operable to output the determined change in EC value.

In another embodiment, the sensor comprises a refractive index measurement system arranged to be used with the food processor to determine a refractive index of the food item under processing. In an alternative configuration, the refractive index measurement system is integrated with the food processor.

The sensor further comprises a controller unit operable to determine a soluble solids content value based on the determined refractive index of the food item.

The controller unit may be configured to output the determined soluble solids content value as the characteristic information related to the food item in the food processor.

The sensor is operable to determine the soluble solids content value continuously in real time during an operation of the food processor.

The above aspects of the invention may be incorporated into a food processor. Accordingly, in another aspect of the invention there is provided a food processor comprising:

a receptacle for receiving a food item to be processed;

a processing unit operable to process the food item in the receptacle;

a monitoring unit configured to monitor a processing status of a food item under processing in a food processor, the monitoring unit comprising:

a sensor operable to determine characteristic information related to the food item in the food processor; and a controller configured to provide a control signal to the processing unit when the determined characteristic information or a rate of change of the determined characteristic information meets a predetermined criteria;

wherein the processing unit is arranged to receive the control signal from the monitoring unit and to operate according to the control signal.

The sensor may be arranged in or in the vicinity of the receptacle such that the characteristic information related to the food item can be determined.

The sensor may include, but not limited to, any one of the following: a particle image analysis system for determining a particle size value of the food item, a conductance sensor for determining an EC value of the food item, and a refractive index measurement system for measuring the refractive index of the food item which is in turn used for determining the soluble solids content value of the food item. The skilled person in the art will appreciate that any suitable means for determining the characteristic information of the food item may be employed. Furthermore, the skilled person in the art will appreciate that two or more means for determining the characteristic information of the food item may be employed simultaneously. This provides the advantage of improving the accuracy of obtaining the desired level of nutrient value.

Preferably, the controller is further configured to provide the control signal to terminate the operation of the food processor when the predetermined criteria is met. This effectively switches off the food processor once the desired level of nutrient value is obtained. Therefore, this allows the food to be blended sufficiently to meet the consumer's expectation in taste, without destroying any nutrients in the food.

In another configuration, the controller may be further configured to provide a control signal to change an operation speed or an operation time of the processing unit. This is advantageous because it allows greater control of the food processor in order to obtain a desired level of nutrient value of the processed food item.

The controller may be further configured to determine a nutrient value based on the determined characteristic information.

The predetermined criteria may include the determined nutrient value being equal to or above a predetermined nutrient value. The predetermined nutrient value may be the desired level of the nutrient value of the processed food item which can be predetermined by the user of the food processor.

The nutrient value may be determined by comparing the determined characteristic information with a predetermined set of nutrient value data.

The characteristic information may include, but not limited to, one or more of the following: a particle size value, an EC value, a pH value, a dry matter value, and a soluble solids content value.

In one embodiment, the sensor may include a particle image analysis system configured to detect an image of the food item under processing in the food processor and to generate a corresponding image data. The particle image analysis system is further configured to process the image data to determine a particle size value of the food item.

The particle image analysis system may comprise an image detection unit.

The image detection unit may include a charge coupled device (CCD) image sensor or a complementary metal-oxide-semiconductor image sensor. However, the skilled person in the art will appreciate that any suitable image detection unit for capturing an image of the food item in the food processor and generating a corresponding image data may be employed. For example, the image detection unit may comprise an optical microscope that operates in cooperation with the CCD image sensor to allow microscopic images to be captured. The optical microscope and the CCD image sensor may be arranged as an integrated unit (i.e. a microscopic CCD image sensor) or provided as separate units having connections with each other.

The particle image analysis system may further comprise an image processing unit operable to process the image data to determine a particle size value of the food item. The image processing unit is further operable to output the determined particle size value as the characteristic information related to the food item in the food processor.

The particle image analysis system may be integrated within a food processor, or may be provided as a separate unit connectable with the food processor. In use, the image detecting unit of the particle image analysis system may be arranged in or in the vicinity of a receptacle for receiving a food item of the food processor such that an image of the food item in the receptacle can be detected when the food processor is in used.

The image detection unit may be configured to detect an image of the food item at a periodic time interval and to generate a corresponding image data at the periodic time interval. Effectively, this allows the particle size value of the food item to be determined periodically. The skilled person in the art will appreciate that the accuracy of the monitoring apparatus improves with the reduction of the time interval between detections of the image of the food item. Accordingly, the image processing unit may be configured to detect an image of the food item continuously in real time during an operation of the food processor.

In another embodiment, the sensor comprises a conductance sensor when in use is in contact with the food item in the food processor, and the conductor sensor is operable to determine an electrical conductivity (EC) value of the food item.

The conductance sensor may comprise two or more electrodes when in use is in contact with the food item in the food processor. Preferably, the conductance sensor comprises a pair of electrodes. In one configuration, the conductance sensor may comprise a pair of electrodes when in use is arranged in a receptacle for receiving a food item of the food processor such that the pair of electrodes are in contact with the food item under processing in order to determine the EC value of the food item.

The conductance sensor may further comprise an output port from which the determined EC value of the food item can be output to a further device.

The further device may be a controller unit. Accordingly, the sensor may further comprise a controller unit configured to determine a change in an EC value of the food item based on the EC value determined over a period of time.

The change in an EC value of the food item may be determined by determining the difference between a determined EC value at a start of an operation of the food processor and a time period after the start of the operation. The time period may be a predetermined time period.

The controller unit may be further operable to output the determined change in EC value.

In another embodiment, the sensor comprises a refractive index measurement system arranged to be used with the food processor to determine a refractive index of the food item under processing. In another configuration, the refractive index measurement system is integrated with the food processor.

The sensor further comprises a controller unit operable to determine a soluble solids content value based on the determined refractive index of the food item.

The controller unit may be configured to output the determined soluble solids content value as the characteristic information related to the food item in the food processor.

The sensor is operable to determine the soluble solids content value continuously in real time during an operation of the food processor.

In a further aspect of the invention there is provided a method for monitoring a processing status of a food item under processing in a food processor, the method comprising:

determining characteristic information related to the food item in the food processor, the characteristic information being associated with a nutrient trend of the food item;

sending a control signal to the food processor to control an operation of the food processor when the determined characteristic information or a rate of change of characteristic information meets a predetermined criteria.

Preferably, the control signal is provided to terminate the operation of the food processor when the predetermined criteria is met.

The method may further determine a nutrient value based on the determined characteristic information.

The predetermined criteria may include the determined nutrient value being equal to or above a predetermined nutrient value.

The nutrient value may be determined by comparing the determined characteristic information with a predetermined set of nutrient values.

The characteristic information may include, but not limited to, one or more of the following: a particle size value, an electrical conductivity value, a pH value, a dry matter value, and a soluble solids content value.

In one embodiment, the method may comprise detecting an image of the food item under processing in the food processor and generating a corresponding image data. The image data is processed to determine a particle size value of the food item.

The determined particle size value may be provided as the characteristic information related to the food item under processing in the food processor.

The method may further comprise detecting an image of the food item at a periodic time interval and generating a corresponding image data at the periodic time interval. Effectively, this allows the particle size value of the food item to be determined periodically. The skilled person in the art will appreciate that the accuracy of the monitoring the processing status improves with the reduction of the time interval between detections of the image of the food item. Accordingly, an image of the food item may be detected continuously in real time during operation of the food processor.

In another embodiment, the method may comprise determining an electrical conductivity (EC) value of the food item.

The determined EC value of the food item may be provided to a control unit in the food processor to determine a change in an EC value of the food item based on the EC value determined over a period of time.

The change in an EC value of the food item may be determined by determining the difference between a determined EC value at a start of an operation of the food processor and a time period after the start of the operation. The time period may be a predetermined time period.

In another embodiment, the method may further comprises determining a refractive index of the food item under processing. Accordingly, a soluble solids content value may be determined based on the determined refractive index of the food item.

The determined soluble solids content value may be provided as the characteristic information related to the food item in the food processor.

The soluble solids content value may be determined continuously in real time during an operation of the food processor.

BRIEF DESCRIPTION OF THE DRAWINGS

Examples of the invention will now be described in detail with reference to the accompanying drawings, in which.

DETAILED DESCRIPTION OF THE EMBODIMENTS

The present invention will now be discussed with reference to several example embodiments in the following paragraphs. It will be appreciated that this is by way of example only, and should not be view as presenting any limitation on the scope of protection sought.

Figure 1:
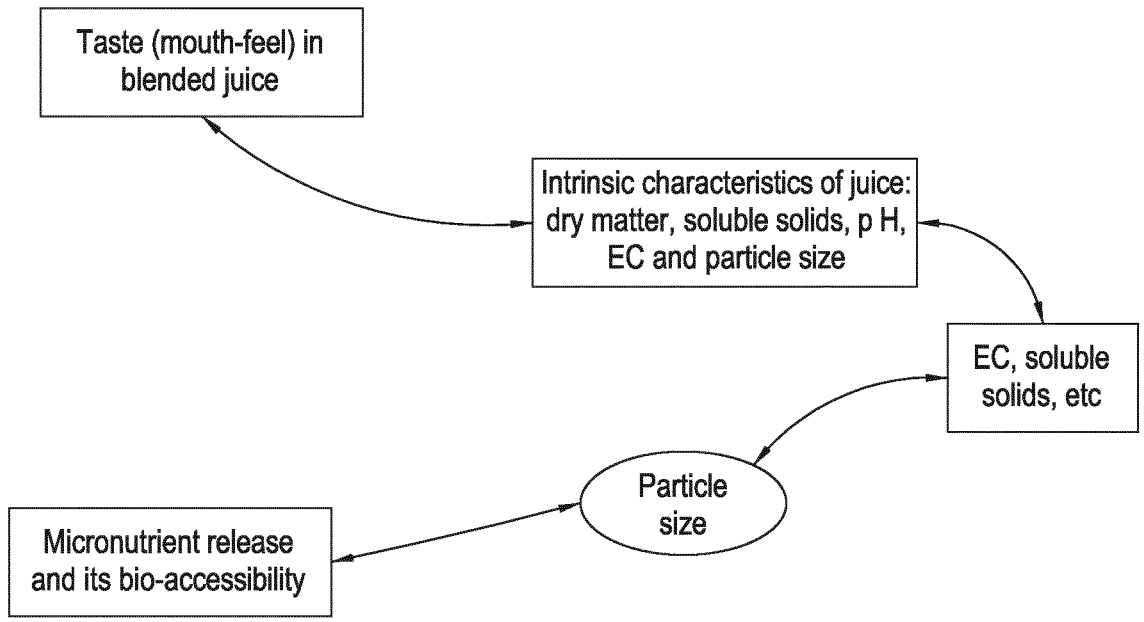
FIG. 1 is a diagram illustrating the relationship between various parameters relating to a food item.
Figure 2:
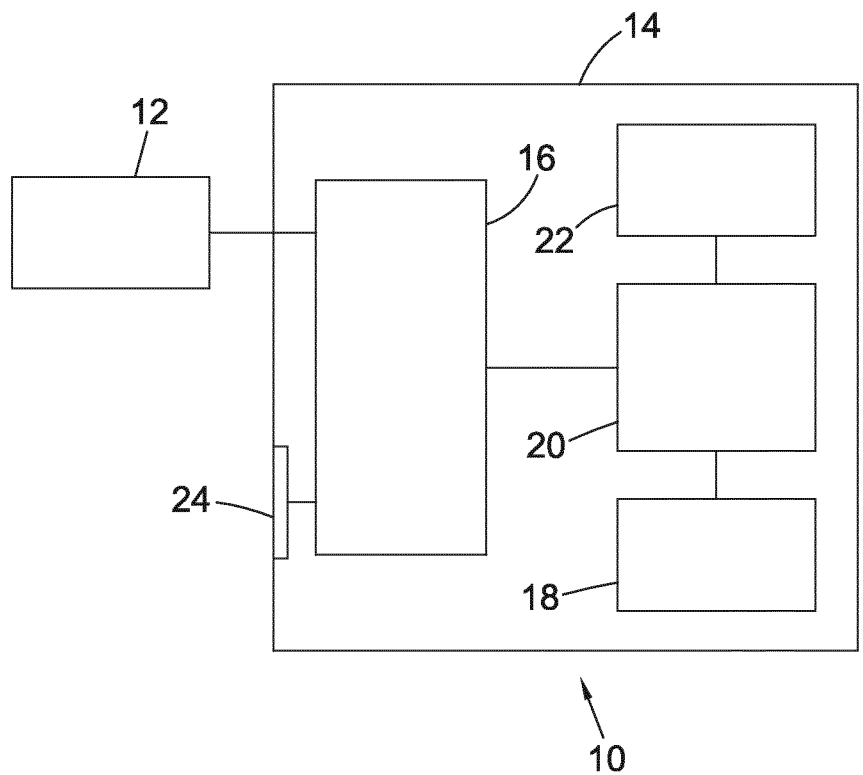
FIG. 2 illustrates a block diagram of an embodiment of the monitoring apparatus in accordance with the invention.

FIG. 2 illustrates a block diagram of an embodiment of the monitoring apparatus in accordance with this invention. The monitoring apparatus 10 comprises a sensor unit 12, and a control unit 14 comprising an input/output (I/O) interface 16, a working memory 18, a signal processor 20, a mass storage unit 22, and data input/output (I/O) port 24. The reader will appreciate that the diagram is schematic, and does not make any direction as to the physical arrangement of these components.

The sensor unit 12 is configured to determine characteristic information, such as an intrinsic characteristic value, of a food item. As will be described in detail in each of the embodiments, in one arrangement, the sensor unit 12 of the monitoring apparatus 10 is provided in a receptacle of food processor in which the food is processed. In another arrangement, the sensor is provided in the vicinity of the receptacle of the food processor.

The sensor unit 12 is connected to the control unit 14. As shown in FIG. 2, the sensor unit 12 is connected to the signal processor 20 via the I/O interface 16. By this connection, an analogue output signal of the sensor unit 12 can be input to the signal processor 20. The I/O interface 16 also includes an analogue-to-digital (ADC) converter (not shown) which converts analogue output signals from the sensor unit 12 into digital input signals. The sensor unit 12 is further arranged to receive an input control signal from the signal processor 20. The input control signal may include signals for controlling the operation of the sensor unit 12, such as a start/stop operation, or it may include signals indicating a time interval between which characteristic information is to be obtained. The skilled person in the art would appreciate the connection between the sensor unit 12 and the control unit 14 comprise a wired or wireless connection.

When in use the monitoring apparatus 10 can be integrated with the food processor, or it can be provided as a separate unit connectable with the food processor.

Figure 3:
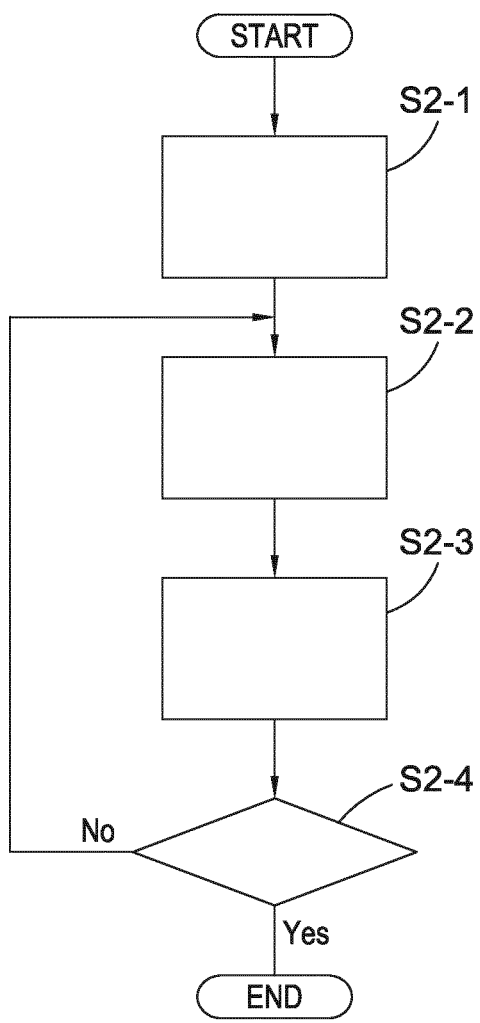
FIG. 3 is a flowchart showing a process according to an embodiment of the invention.

The signal processor 20 is operable to execute machine code instructions stored in a working memory 18 and/or retrievable from a mass storage unit 22. The signal processor 20 processes the incoming signals in accordance with the method described in the forthcoming paragraphs. For clarity, a flow diagram is also included in FIG. 3.

The process commences with an initialisation process in step S2-1 which include receiving a data signal, via the data I/O port 24 and the I/O interface 16, from the food processor indicating a start operation of the food processor.

Step S2-2: Determine at least one intrinsic characteristic value of the food item in the receptacle of the food processor. The skilled person in the art will appreciate that this step can be carried out continuously in real time or it can be performed at a periodic time interval. The periodic time interval can be predetermined by the user of the food processor before the start operation and data relating to the predetermined time interval can provided to the sensor during the initialisation process in step S2-1.

Step S2-3: Determine the nutrient value based on the intrinsic characteristics value of the food item obtained in step S2-2. One example of determining the nutrient value is by comparing the determined intrinsic characteristic value with a look up table comprising a set of predetermined nutrient value and a corresponding set of predetermined intrinsic characteristics value stored in the mass storage unit 20, and selecting a predetermined nutrient value with a corresponding predetermined intrinsic characteristics value that is closest to the determined intrinsic characteristics value.

Step S2-4: Check whether the determined nutrient value meets a predetermined criteria. For example, the signal processor 18 can be configured to perform a process to check whether the determined nutrient value exceeds a predetermined threshold nutrient value. If the determined nutrient value meets the predetermined criteria, the process will be terminated. Otherwise, steps S2-2 to S2-4 will be repeated.

Alternatively, the signal processor 20 processes the incoming signals in accordance with the method described in the following paragraphs. The flow diagram in FIG. 3 is used again to illustrate the alternative method.

Similarly, the process commences with an initialisation process in step S2-1 which include receiving a data signal, via the data I/O port 24 and the I/O interface 16, from the food processor indicating a start operation of the food processor.

Step S2-2: Determine at least one intrinsic characteristic value of the food item in the receptacle of the food processor. The skilled person in the art will appreciate that this step can be carried out continuously in real time or it can be performed at a periodic time interval. The periodic time interval can be predetermined by the user of the food processor before the start operation and data relating to the predetermined time interval can provided to the sensor during the initialisation process in step S2-1.

Step S2-3: As will be described further in the forthcoming paragraphs, in some embodiments of the invention, a rate of change of intrinsic characteristic value may also be determined.

Step S2-4: Determine whether the determined intrinsic characteristic value or the determined rate of change of intrinsic characteristic value meets a predetermined criteria. If the determined intrinsic characteristic value or the determined rate of change of characteristic value meets the predetermined criteria, the process will be terminated. Otherwise, steps S2-2 to S2-4 will be repeated.

Figure 4:
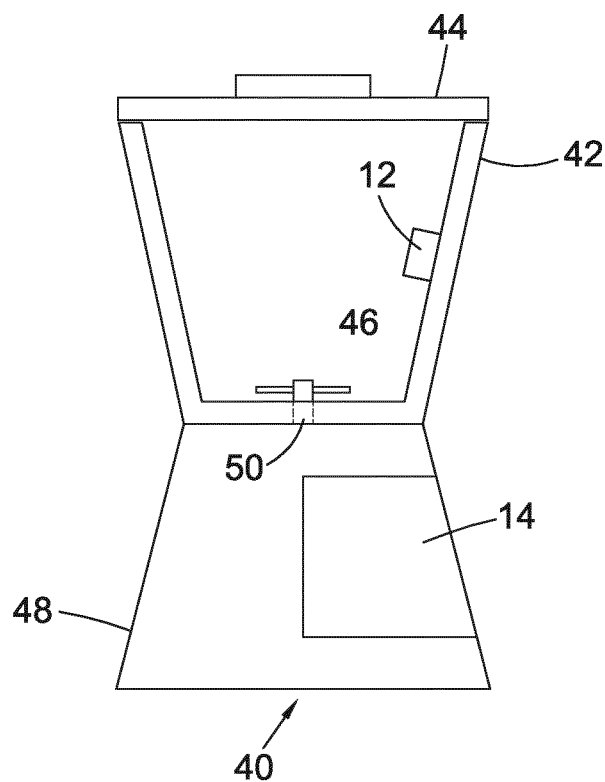
FIG. 4 illustrates a food processor provided with a monitoring apparatus in accordance with an embodiment of the invention.

FIG. 4 illustrates a food processor 40 provided with a monitoring apparatus in accordance with this invention.

The food processor 40 comprises a receptacle 42 for receiving and/or processing food items. As shown in FIG. 4, a removable lid 44 is optionally provided at a top of the receptacle 42. A rotatable blade 46 is arranged at the bottom of the receptacle 42, and the rotatable blade 46 is operable to rotate so as to cut the food items to reduce its particle size or into a liquid form when the food processor 40 is in operation. The food processor 40 further comprises a base unit 48. The receptacle 42 is detachably mounted on top of the base unit 48. The base unit 48 houses a motor (not shown) having a driving shaft 50 extending from the base 48 so that when the receptacle 42 is mounted on the top of the base unit 48, the driving shaft 50 is operatively connected to the rotatable blade 46. Similar to many of the food processor in the market, the base unit includes a user interface (not shown), such as for example, push buttons and rotary knobs or a touch screen interface, for the user to control or pre-program the operation of the food processor 40. The skilled person in the art will appreciate that the food processor described in this paragraph have been presented by way of example only, and any suitable food processor can be provided with the monitoring apparatus of this invention.

As shown in FIG. 4, the sensor unit 12 is provided in the receptacle 42. In an alternative configuration, the sensor unit 42 is provided in the vicinity of the receptacle 42. For example, depending on the type of sensor unit implemented, the sensor unit 12 can be provided on an outer surface of the receptacle 42. The sensor unit 12 is provided on an inner side wall of the receptacle 42 in this example. However, it is noted that the sensor unit 12 can also be provided anywhere in the receptacle 42, for example at the bottom of the receptacle 42.

In this example, the control unit 14 of the monitoring apparatus is arranged within the base unit 48 of the food processor 40. The skilled person in the art will appreciate that in an alternative arrangement, the control unit 14 of the monitoring apparatus is arranged as separate units from the base unit 48.

Figure 5:
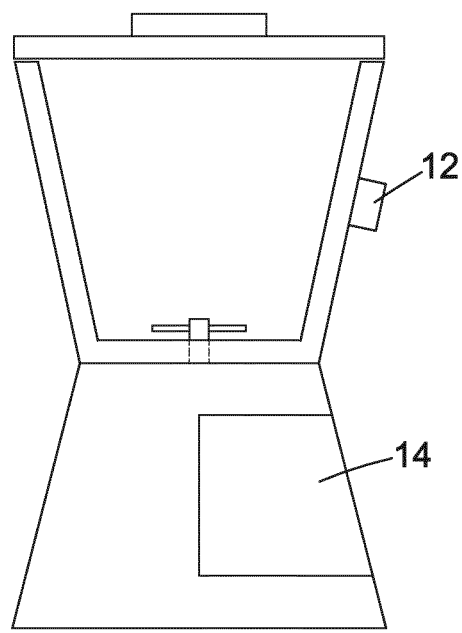
FIG. 5 illustrates a food processor provided with a monitoring apparatus in accordance with an embodiment of the invention.

FIG. 5 illustrates a food processor 40 provided with a monitoring apparatus in accordance with an embodiment of this invention. As shown in FIG. 5, the sensor unit 12 is arranged on an outer surface of a receptacle 42 of the food processor 40.

In this embodiment, the sensor unit 12 includes a microscope charge coupled device (CCD) image sensor operable to capture an image of the food item and to generate an image data. The microscope CCD image sensor is provided on an outer wall of the receptacle 42 and arranged to capture images of the food items in the receptacle 42. The skilled person in the art will appreciate that in this embodiment any suitable sensor unit 12 for capturing an image of the food item in the receptacle of the food processor 40 and generating a corresponding image data may be employed.

In operation, upon receiving an input control start signal from the signal processor 20 indicating a start operation of the food processor 40, the microscope CCD image sensor captures an image of the food item either continuously or at a predetermined periodic time interval until a control stop signal is received from the signal processor once the desired level of nutrient value or particle size is obtained.

The microscope CCD image sensor outputs image data corresponding to the image captured to the signal processor 20. The signal processor 20 processes the image data to determine a particle size value of the food item under processing. In one configuration, the signal processor 20 is configured to send an output control signal to terminate the operation of the food processor 40 once the determined particle size meets a predetermined criteria, such as it being smaller or equal to a predetermined particle size. In another configuration, the signal processor 20 determines a nutrient value by comparing the determined particle size value with a look up table comprising a set of predetermined nutrient value and a corresponding set of predetermined particle size value stored in the mass storage unit 20, and selecting a predetermined nutrient value with a corresponding predetermined particle size value that is closest to the determined particle size value.

The signal processor 20 is configured to send a stop control signal via the I/O interface 16 and the data port 24 to the food processor 40 to terminate the operation of the food processor 40 once the determined nutrient value is equal to or exceeds a predetermined threshold nutrient value. The signal processor 20 is also configured to send a control stop signal to the microscope CCD image sensor to terminate its operation.

The predetermined threshold nutrient value can be predetermined by the user before the operation of the food processor 40 is commenced. This can be carried out through a user interface, such as a control panel (not shown), provided at the base unit of the food processor. Alternatively, the user could also predefine a particle size of the food item by selecting from a menu which provides the following particle size selections: large, medium, and fine, through the user interface. Such selections could also be provided by means of push buttons. The user interface is in communication with the control unit 14 of the monitoring apparatus 10 as well as any circuitry inside the base unit 48 for controlling the function of the food processor 14. In one arrangement, the control unit 14 of the monitoring apparatus 10 is integrated with the control circuitry of the food processor 40. It will be appreciated that any suitable means of user interface may be employed, and therefore details of the user interface will not be described.

Figure 6:
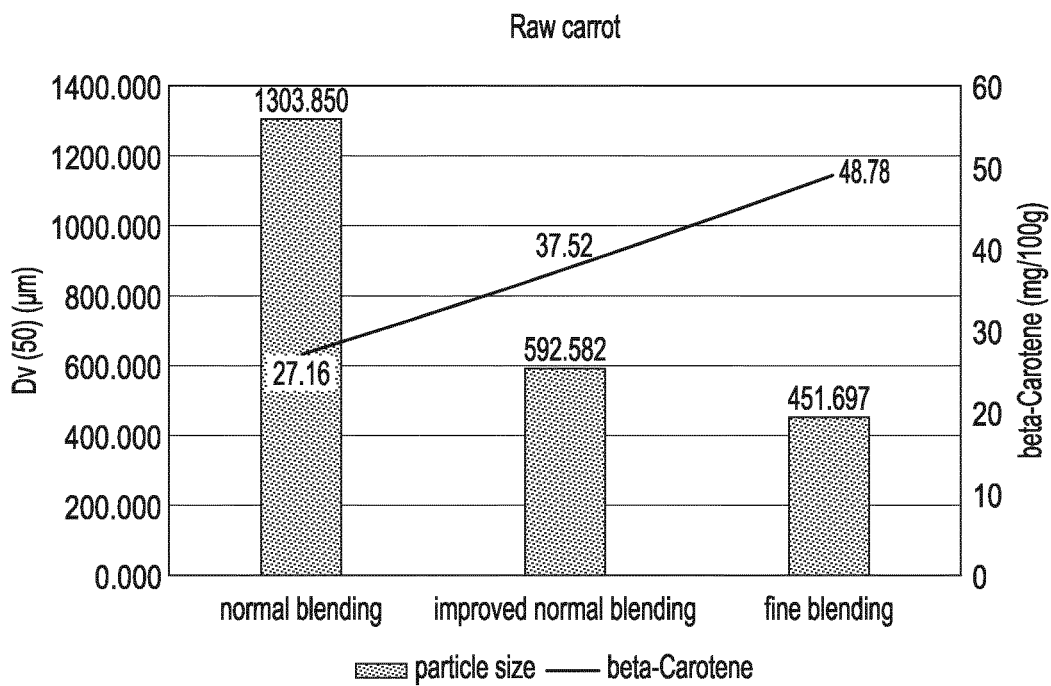
FIG. 6 illustrates a comparison in different types of blending that resulted in different particle size of the processed food.

As described in the preceding paragraphs, fine food particle size allows a higher nutrient release from the food and increases the bioavailability of nutrients. The graph in FIG. 6 illustrates a comparison in different types of blending that resulted in different particle size of the processed food. In this case, blended raw carrots is used to demonstrate that the beta-Carotene content of the carrots increases with reduced particle size.

Figure 7:
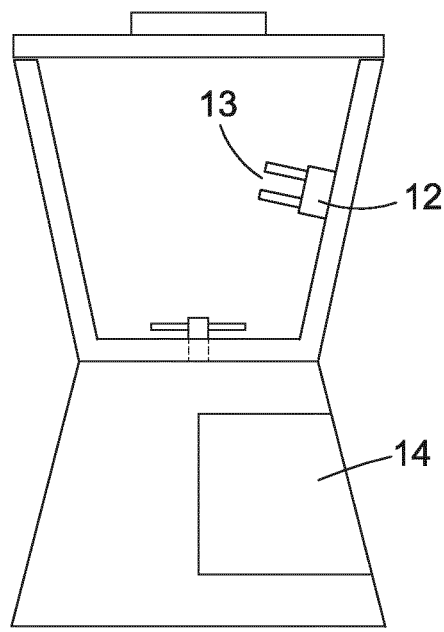
FIG. 7 illustrates a food processor provided with a monitoring apparatus in accordance with another embodiment of the invention.

Referring to FIG. 7, in another embodiment, the sensor unit 12 comprises an electrical conductance sensor 13 having a pair of electrodes arranged in the receptacle 42 of the food processor 40 such that the pair of electrodes are in contact with the food item under processing. The pair of electrodes is arranged to determine the electrical conductivity (EC) of the food item, so that a change in EC of the food item under processing over a time period can be determined. Typically, the electrodes are made of platinum metal and are cylindrical. However, it is noted that the electrodes can be made of other materials or shape. For example, the electrical conductance sensor 13 may comprise a pair of stainless steel electrical plates. It is further noted the most prominent materials for electrodes are copper, graphite, titanium, brass, silver, and so on.

The control unit 14 of the monitoring apparatus 10 is arranged within the base unit 48 of the food processor 40. As it will be appreciated the control unit 14 can be also be arranged with the control circuitry (not shown) of the food processor 40. The communication data link between the control unit 14 and the sensor unit 12 of the monitoring apparatus 10 can either be a wired link or a wireless link. In operation, the communication data link allows the control unit 14 to transmit a start/stop control signal to control to the operation of the sensor unit 12, and to receive data signals representing the measured EC value of the food item under processing.

Figure 8:
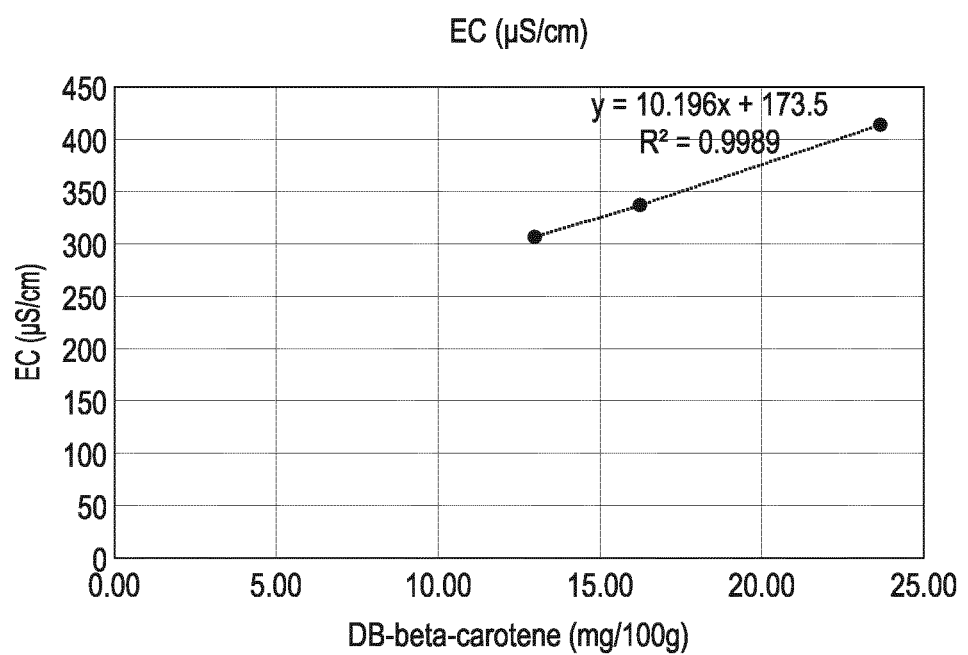
FIG. 8 illustrates the relationship between the beta-Carotene content of and electrical conductivity value.

The graph in FIG. 8 illustrates the beta-Carotene content of carrots increases with increased EC value, which demonstrates that EC value is a good demonstrator for indicating the status of micronutrients release.

Figure 9A:
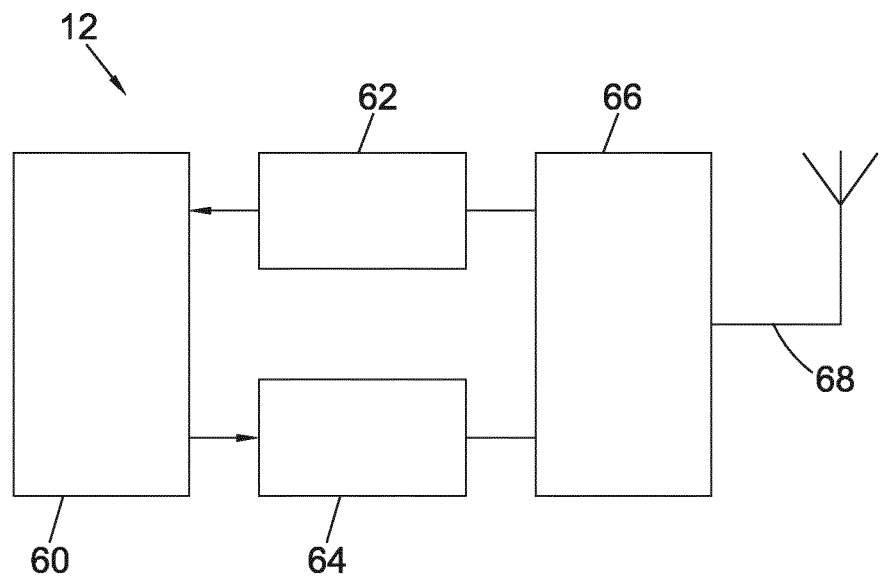
FIG. 9A illustrates a block diagram of the sensor unit of the embodiment of the monitoring apparatus in FIG. 7.

As illustrated in FIG. 7, the sensor unit 12 is connected with the control unit 14 of the monitoring apparatus 10 via a wireless link. Accordingly, as illustrated in the schematic diagram in FIG. 9A, the sensor unit 12 in this embodiment comprises an electrical conductance sensor 60 having a pair of electrodes (not shown). The sensor unit 12 further comprises a drive source 62 operable to provide an electrical charge through one of the electrodes upon receiving a start control signal from the control unit 14, and a digitising electrical conductance circuit 64 arranged to measure the electrical conductance and to convert it into a digital signal representing the measured EC value. The digitised EC data signal is provided to a communication unit 66 which in turn is transmitted to the control unit 14 via antenna 68.

Figure 9B:
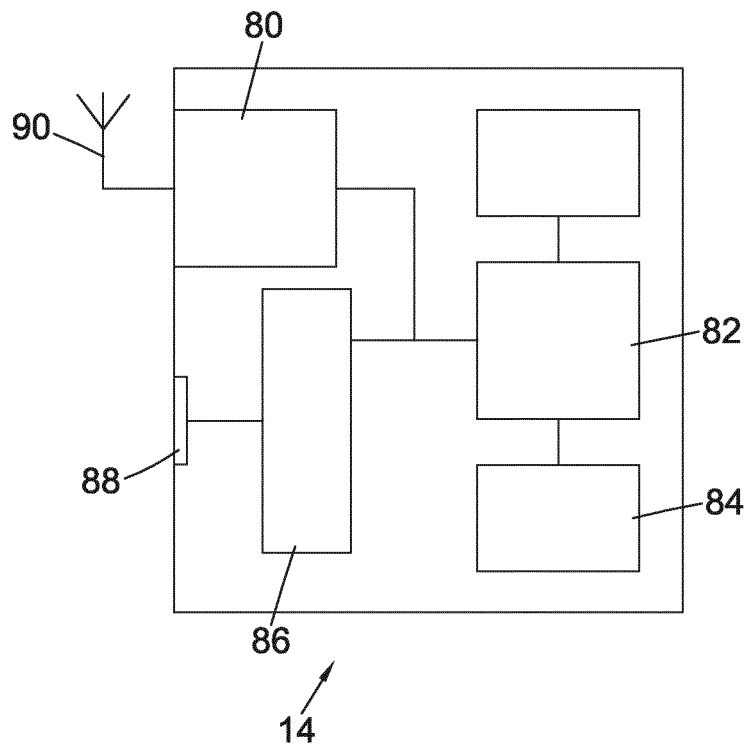
FIG. 9B illustrates a block diagram of the control unit of the embodiment of the monitoring apparatus in FIG. 7.

As shown in FIG. 9B, the control unit 14 in this embodiment comprises a communication unit 80 configured to receive the EC data signal. The received signal is converted into a digital signal before being provided to the signal processor 82 for processing. The signal processor 82 determines whether the received EC data signal is a first EC data signal since the start of operation of the food processor, and if it is the first EC data signal, the signal processor stores the first EC data signal in the working memory 84. The signal processor 82 is configured to compare subsequent EC data signals with the first EC data signals to determine a change in the EC values of the food item.

In one configuration, the signal processor 82 is configured to send an output control signal to terminate the operation of the food processor 40 once the determined change in EC values falls within a predetermined range of change in EC values. For example, the signal processing unit is configured to send the output control signal once the determined change in EC values falls within the range of 10% to 40%. It is noted that the example range in the change of EC values provided is based on laboratory tests on raw carrots and is only used herewith for purpose of description, not to limit the scope of protection of the invention. More importantly, the skilled person will appreciate that suitable ranges would have to be predetermined for different food types. The signal processor 82 is also configured to send a stop control signal to the sensor unit 12 to terminate its operation at the same time.

In another configuration, the signal processor 18 determines a nutrient value by comparing the determined change in EC values with a look up table comprising a set of predetermined nutrient value and a corresponding set of predetermined change in EC values stored in the mass storage unit 20, and selecting a predetermined nutrient value with a corresponding predetermined change in EC values that is the closest to the determined change in EC values. The signal processor 18 is configured to send a stop control signal via the I/O interface 86 and the data port 88 to the food processor 40 to terminate the operation of the food processor 40 when the determined nutrient value is equal to or exceeds a predetermined threshold nutrient value. The signal processor 82 is also configured to send a control stop signal to the sensor unit 12 to terminate its operation.

Although it is described in the above example that the sensor unit 12 and the control unit 14 of the monitoring apparatus are connected via a wireless communication link, the skilled person in the art will appreciate they can also be connected via a wired connection. Therefore, in an alternative arrangement of this embodiment, the control unit 14 and the sensor unit 12 are provided as a single unit in the receptacle 42 of the food processor 40. In such an arrangement, the control unit 14 of the monitoring apparatus 10 is in communication with the circuitry in the base unit of the food processor 40 via a wireless link. Alternatively, the control unit 14 of the monitoring apparatus 10 is provided within the base unit 48 of the food processor 40, and a wired connection can be provided through the driving shaft 50 of the motor into the receptacle 42 to establish a physical wired connection with the sensor unit.

In another embodiment, the sensor unit comprises a refractive index measurement device arranged to be used with the food processor 40 when the food item is under processing to determine a soluble solids content value of the food item. The refractive index measurement device in this invention is based on the working principle of a refractometer known in the art. The skilled reader will understand that a refractometer utilises the refraction of light to measure the soluble solids content of the food item.

Figure 10:
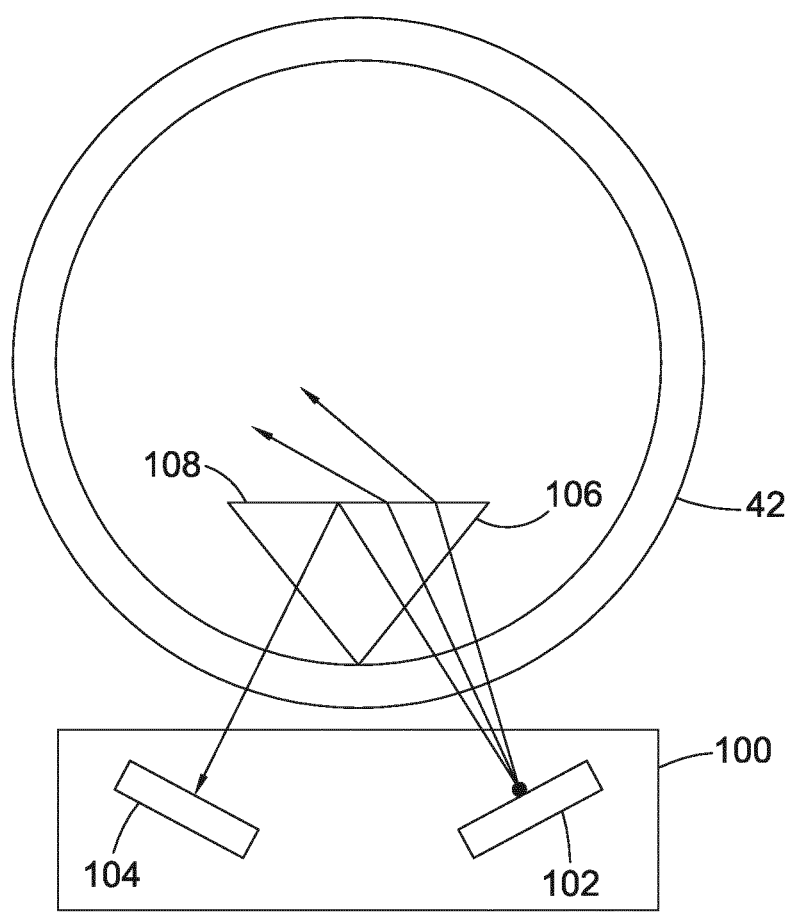
FIG. 10 is top view of a receptacle of the food processor provided with a refractive index measurement device.

FIG. 10 is a top view of a receptacle of the food processor provided with the refractive index measurement device of this invention. FIG. 10 is used herein for illustrating the working principle of the refractive measurement device of this invention. As illustrated in FIG. 10, the refractive index measurement comprises an optical unit 100 including an optical source 102 and an optical detector 104 (such as a charge coupled detector, CCD), and an optical element 106 (such as for example, a prism) arranged in the receptacle 42 of the food processor 40. In operation, the light source 102 is arranged so that it is focused at the prism 106 and the light source 102 transmits an optical signal towards the prism 106 and into food item under processing. If the angle of incidence exceeds a critical value, the light is reflected at the prism-food item boundary 108. The reflected light is detected by the CCD 104. It is noted that the refractive index of the sample can be calculated using the ratio of the illuminated region and the unilluminated region of the CCD 104. As it will be appreciated, the refractive index is dependent on the wavelength of the light, and typically an interference filter (not shown) can be arranged between the optical source 102 and the prism 106 to obtain a desired wavelength. For example, a commonly used wavelength of light for a refractometer is 589 nm. However, the skilled person will appreciate that other wavelengths of light could also be used.

Figure 11:
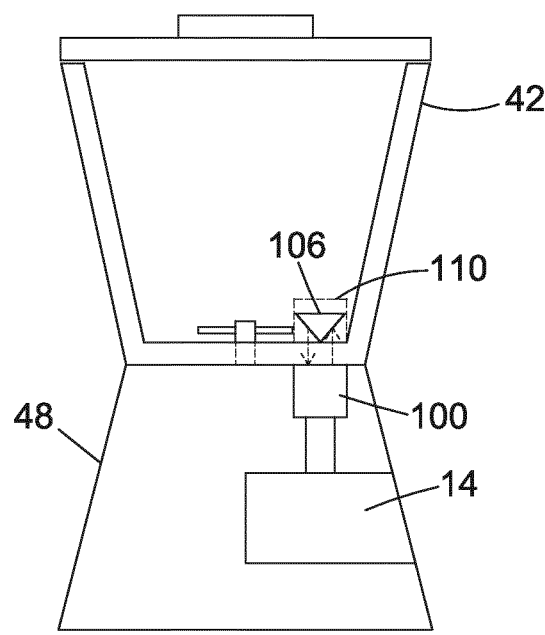
FIG. 11 illustrates a food processor provided with a monitoring apparatus in accordance with a further embodiment of the invention.

FIG. 11 illustrates one example arrangement of this embodiment of the invention. As illustrated in FIG. 11, the prism 106 is provided at the bottom of the receptacle 42 of the food processor 40. The optical unit 100 including the optical source 102 and the optical detector 104 is provided at the top of the base unit 48 of the food processor 40. The prism 106, optical source 102, and the optical detector 104 are arranged such that when the receptacle 42 is mounted on the base unit 48, the optical source 102 is directed at the prism 106, and any light from the optical source 102 that are reflected by the prism is detected by the optical detector 104. Optionally a mesh 110 is arranged around the prism to filter large food particles.

Figure 12:
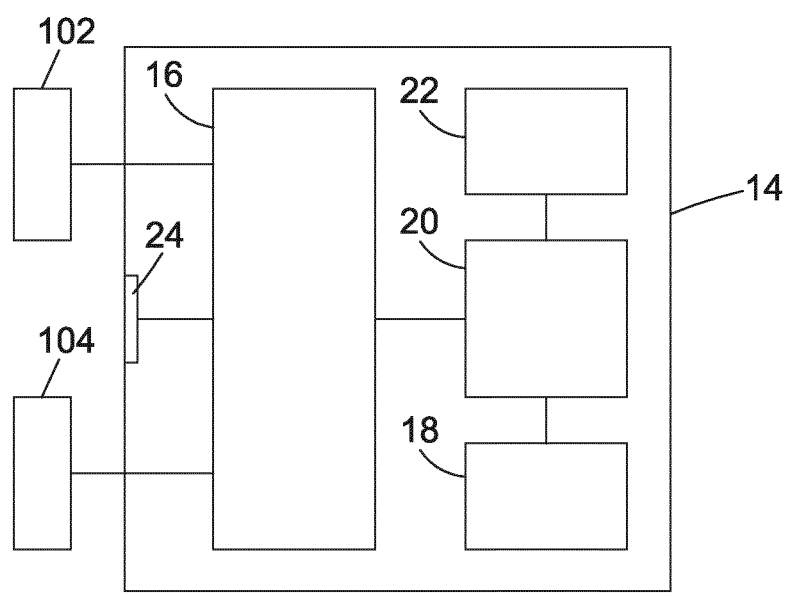
FIG. 12 illustrates a block diagram of the monitoring apparatus of FIG. 11.

As shown in the schematic diagram in FIG. 12, the optical source 102 and the optical detector 104 are connected to the signal processor 20 of the control unit 14 of the monitoring apparatus 10 via I/O interface 16. Once the signal processor 20 receives a control signal, for example from the control circuity of the food processor, indicating a start operation of the food processor, the signal processor 20 in turn transmits a start control signal to the optical source 102 to begin transmission of light at a predetermined wavelength towards the prism 106. The transmitted lights that are reflected from the prism 106 are detected on a detecting surface (not shown) of the optical detector 104 and provided to the signal processor 20 for further processing. The signal processor 20 processes executable instructions corresponding with underlying software implemented processes, based on the working principle of a refractometer described in the preceding paragraphs, and determines the refractive index value associated with the food item under processing. As is known in the art, the soluble solids content of the food item has a proportional effect on the refractive index, and hence the soluble solids content value can determined based on the determined refractive index, for example by means of a look up table.

In one configuration, the signal processor 20 is configured to send an output control signal to terminate the operation of the food processor 40 once the determined soluble solids content value falls within a predetermined range soluble solids content values. The soluble solids content value is often expressed in units of Brix (%) which is a scale used to measure the amount of total soluble solids dissolved within a substance. For example, the signal processor 20 is configured to send an output control signal once the determined soluble solids content value falls within the range of 0.2% to 7% for fresh vegetables, 7% to 20% for fresh fruits, and so on. The signal processor 20 is also configured to send a stop control signal to the optical source to terminate its operation at the same time.

In another configuration, the signal processor 20 determines a nutrient value by comparing the determined soluble solids content value with a look up table comprising a set of predetermined nutrient value and a corresponding set of predetermined soluble solids content value stored in the mass storage unit 20, and selecting a predetermined nutrient value with a corresponding predetermined soluble solids content value that is the closest to the determined soluble solids content value. The signal processor 20 is configured to send a stop control signal via the I/O interface 16 and the data port 24 to the food processor 40 to terminate the operation of the food processor 40 once the determined nutrient value exceeds a predetermined threshold nutrient value. The signal processor 20 is also configured to send a control stop signal to the optical source 102 to terminate its operation.

Figure 13:
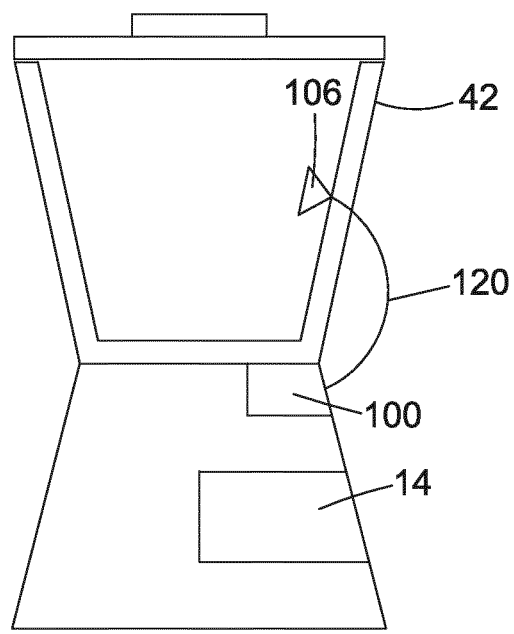
FIG. 13 illustrates an alternative arrangement of the monitoring apparatus of FIG. 11.

In another arrangement, and as illustrated in FIG. 13, the prism 106 is arranged on an inner side surface of the receptacle 42 and the optical unit 100 is provided within the base unit 48 of the food processor 40. In this arrangement, the optical unit 100 is connected with the prism 106 via an optical fibre cable 120 which allows transmitted light and the reflected light to travel therebetween. The working principle remains the same as the arrangement described in the preceding paragraphs.

Figure 14:
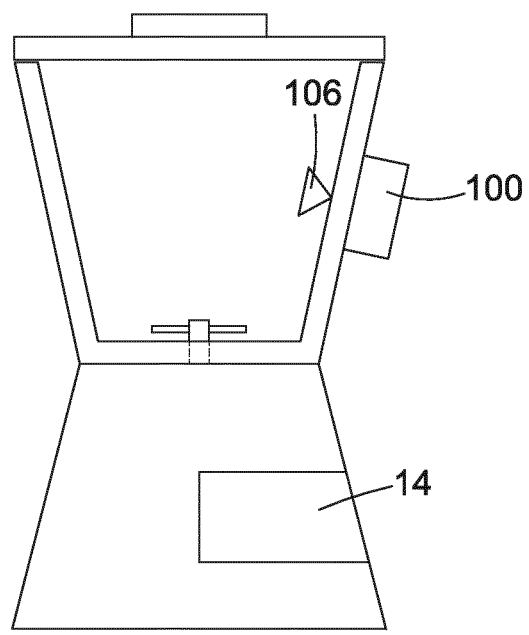
FIG. 14 illustrates another alternative arrangement of the monitoring apparatus of FIG. 11.

In yet another arrangement as shown in FIG. 14, the prism 106 is arranged on an inner side surface of the receptacle 42 and the optical unit 100 including the optical source and the optical detector is arranged on an outer surface such that the optical source is directed at the prism 106, and any light from the optical source that are reflected by the prism is detected by the optical detector. In this arrangement, the optical unit 100 and the control unit 14 of the monitoring apparatus 10 each further includes a wireless comminution module (not shown) to allow control and data signals to be transmitted between the optical unit 100 and the control unit 14.

While the foregoing specific description of an embodiment of the invention has been provided for the benefit of the skilled reader, it will be understood that it should not be read as mandating any restriction on the scope of the invention. The invention should be considered as characterised by the claims appended hereto, as interpreted with reference to, but not bound by, the supporting description.

The invention claimed is:

1. A monitoring apparatus configured to monitor a processing status of a food item under processing in a food processor, wherein the monitoring apparatus comprises:
    a sensor operable to determine characteristic information related to the food item in the food processor, wherein the characteristic information is associated with a nutrient release trend of the food item; and
    a controller configured to:
        determine a nutrient value of the food item based at least in part on a comparison of the characteristic information with predetermined characteristic information; and
        provide a control signal to the food processor to control an operation of the food processor when the characteristic information or a rate of change of the characteristic information meets predetermined criteria, wherein the predetermined criteria is based at least in part on the determined nutrient value.

2. The monitoring apparatus according to claim 1, wherein the controller is further configured to provide the control signal to terminate the operation of the food processor when the predetermined criteria are met.

3. The monitoring apparatus according to claim 1, wherein the predetermined criteria include the determined nutrient value being equal to or above a predetermined nutrient value.

4. The monitoring apparatus according to claim 1, wherein the characteristic information includes one or more of following: a particle size value, an electrical conductivity value, a pH value, a dry matter value, and a soluble solids content value.

5. The monitoring apparatus according to claim 1, wherein the sensor comprises a particle image analysis system configured to detect an image of the food item under processing in the food processor and to generate a corresponding image data.

6. The monitoring apparatus according to claim 5, wherein the particle image analysis system is further configured to process the image data to determine a particle size value of the food item.

7. The monitoring apparatus according to claim 1, wherein the sensor comprises a conductance sensor, wherein the conductance sensor, when in use, is in contact with the food item under processing in the food processor, and wherein the conductance sensor is operable to determine an electrical conductivity (EC) value of the food item.

8. The monitoring apparatus according to claim 7, wherein the conductance sensor comprises a pair of electrodes, wherein the pair of electrodes, when in use, is arranged in a receptacle for processing the food item of the food processor such that the pair of electrodes are in contact with the food item under processing in order to determine the EC value of the food item.

9. The monitoring apparatus according to claim 7, wherein the controller is further configured to determine a change in an EC value of the food item based on the EC value determined over a period of time.

10. The monitoring apparatus according to claim 9, wherein the controller is further configured to output the determined change in the EC value.

11. The monitoring apparatus according to claim 1, wherein the sensor comprises a refractive index measurement system arranged to determine a refractive index of the food item under processing.

12. The monitoring apparatus according to claim 11, wherein the sensor is further operable to determine a soluble solids content value of the food item based on the determined refractive index of the food item.

13. The food processor comprising:
    a receptacle for receiving a food item to be processed;
    a processing unit operable to process the food item in the receptacle; and
    the monitoring apparatus in accordance with claim 1,
    wherein the processing unit is arranged to receive the control signal from the monitoring apparatus and to operate according to the control signal.

14. A method for monitoring a processing status of a food item under processing in a food processor, wherein the method comprises:
    determining characteristic information related to the food item in the food processor, wherein the characteristic information is associated with a nutrient release trend of the food item;
    determining a nutrient value of the food item based at least in part on comparing the characteristic information with predetermined characteristic information; and
    sending a control signal to the food processor to control an operation of the food processor when the characteristic information or a rate of change of the characteristic information meets predetermined criteria, wherein the predetermined criteria is based at least in part on the determined nutrient value.

* * * * *